US012604755B2

(12) United States Patent
Kirby et al.

(10) Patent No.: US 12,604,755 B2
(45) Date of Patent: *Apr. 14, 2026

(54) SEMICONDUCTOR DEVICE INTERCONNECTS FORMED THROUGH VOLUMETRIC EXPANSION

(71) Applicant: Micron Technology, Inc., Boise, ID (US)

(72) Inventors: Kyle K. Kirby, Eagle, ID (US); Terrence B. McDaniel, Boise, ID (US); Wei Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 517 days.

This patent is subject to a terminal disclaimer.

(21) Appl. No.: 18/199,741

(22) Filed: May 19, 2023

(65) Prior Publication Data

US 2024/0071968 A1 Feb. 29, 2024

Related U.S. Application Data

(60) Provisional application No. 63/401,678, filed on Aug. 28, 2022.

(51) Int. Cl.
H01L 23/00 (2006.01)

(52) U.S. Cl.
CPC .............. H01L 24/08 (2013.01); H01L 24/05 (2013.01); H01L 24/80 (2013.01); *H01L 2224/05567* (2013.01); *H01L 2224/05571* (2013.01); *H01L 2224/05647* (2013.01); *H01L 2224/0807* (2013.01); *H01L 2224/08123* (2013.01); *H01L 2224/08145* (2013.01); *H01L*

*2224/80365* (2013.01); *H01L 2224/80379* (2013.01); *H01L 2224/80896* (2013.01);
(Continued)

(58) Field of Classification Search
None
See application file for complete search history.

(56) References Cited

U.S. PATENT DOCUMENTS 5,442,235 A * 8/1995 Parrillo .............. H01L 23/5226
257/762
2015/0315720 A1* 11/2015 Mayer ................... C25D 21/18
204/232
(Continued)

*Primary Examiner* — Michael Lebentritt
(74) *Attorney, Agent, or Firm* — Dorsey & Whitney LLP

(57) ABSTRACT

This document discloses techniques, apparatuses, and systems for semiconductor device interconnects formed through volumetric expansion. A semiconductor assembly is described that includes two semiconductor dies. The first semiconductor die and the second semiconductor die are bonded at a dielectric layer of the first semiconductor die and a dielectric layer of the second semiconductor die to create one or more interconnect openings. The first semiconductor die includes a reservoir of conductive material located adjacent to the one or more interconnect openings and having a width greater than a width of the one or more interconnect openings. The reservoir of conductive material is heated to volumetrically expand the reservoir of conductive material through the one or more interconnect openings to form one or more interconnects electrically coupling the first semiconductor die and the second semiconductor die. In this way, a connected semiconductor device may be assembled.

20 Claims, 14 Drawing Sheets

(52) U.S. Cl.
CPC .............. *H01L 2924/04642* (2013.01); *H01L 2924/0504* (2013.01); *H01L 2924/0554* (2013.01); *H01L 2924/059* (2013.01)

(56) References Cited

U.S. PATENT DOCUMENTS

| | | | | |
|---|---|---|---|---|
| 2019/0035640 | A1* | 1/2019 | Thorkelsson | ..... H01L 21/67075 |
| 2019/0319007 | A1* | 10/2019 | Uzoh | ...................... H01L 24/80 |
| 2024/0071823 | A1* | 2/2024 | Kirby | ............... H01L 23/53228 |

* cited by examiner

200b

202

204                    222

220

300b

302

304                                                            326

400b

402

404          422

600

602

604

606

800

900

Provide a first semiconductor die including a first dielectric layer having one or more first openings with a first width and a first reservoir of conductive material located adjacent to the one or more first openings, the first reservoir of conductive material having a second width greater than the first width
902

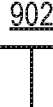

Provide a second semiconductor die including a second dielectric layer having one or more second openings corresponding to the one or more first openings
904

Align the first dielectric layer and the second dielectric layer such that the one or more first openings align with the one or more second openings to create one or more interconnect openings
906

Heat the first dielectric layer, the second dielectric layer, and the first reservoir of conductive material effective to bond the first dielectric layer and the second dielectric layer and cause the first reservoir of conductive material to volumetrically expand through the one or more interconnect openings to form one or more interconnects electrically coupling the first semiconductor die and the second semiconductor die
908

*FIG. 9*

SEMICONDUCTOR DEVICE INTERCONNECTS FORMED THROUGH VOLUMETRIC EXPANSION

CROSS-REFERENCE TO RELATED APPLICATION(S)

The present application claims priority to U.S. Provisional Patent Application No. 63/401,678, filed Aug. 28, 2022, the disclosure of which is incorporated herein by reference in its entirety.

TECHNICAL FIELD

The present disclosure generally relates to semiconductor device assemblies, and more particularly relates to semiconductor device interconnects formed through volumetric expansion.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIG. 9 illustrates an example method for fabricating a semiconductor device assembly in accordance with an embodiment of the present technology.

DETAILED DESCRIPTION

Semiconductor devices are integrated into many devices to implement memory cells, processor circuits, imager devices, and other functional features. As more applications for semiconductor devices are discovered, designers are tasked with creating improved devices that can perform a greater number of operations per second, store greater amounts of data, or operate with a higher level of security. To accomplish this task, designers continue to develop new techniques to increase the number of circuit elements on a semiconductor device without increasing the size of the device. This development, however, may not be sustainable due to various challenges that arise from designing semiconductor devices with high-circuit density. Thus, additional techniques may be required to continue the growth in capability of semiconductor devices.

One such technique is to implement multiple semiconductor dies within a single package. These multiple dies may be stacked to increase the number of circuit elements within the package without increasing a footprint (e.g., horizontal area) of the device. Stacked semiconductor devices (e.g., three-dimensional interface (3DI) packaging solutions) are often implemented as a set of multiple semiconductor dies disposed on silicon wafers. Each of the multiple semiconductor dies may include metallization layers that provide various functionality. These semiconductor dies are physically and electronically connected to one another to enable electrical communication between the dies. Many solutions for connecting semiconductor dies, however, may be suboptimal for producing a reliable, well-connected semiconductor device. One such semiconductor device assembly is illustrated by way of example in FIG. 1A.

Figure 1A:
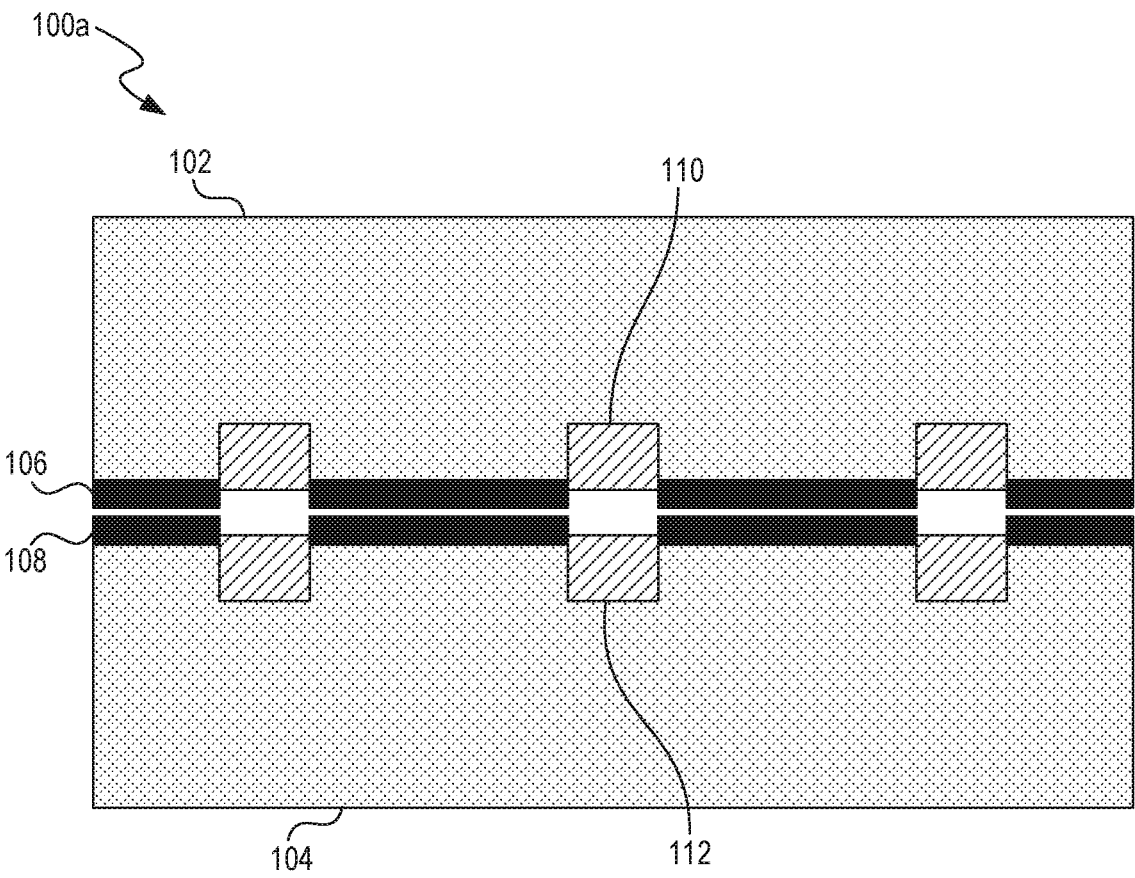
FIGS. 1A and 1B illustrate simplified schematic cross-sectional views of a series of fabrication steps for semiconductor device assemblies.

Beginning with FIG. 1A, a semiconductor device assembly 100a includes a semiconductor die 102 and a semiconductor die 104. The semiconductor die 102 may include a dielectric layer 106 at a bonding surface of the semiconductor die 102 (e.g., the lower surface of the semiconductor die 102 as illustrated), and the semiconductor die 104 may include a dielectric layer 108 at a bonding surface of the semiconductor die 104. The dielectric layer 106 and the dielectric layer 108 may act as a passivized, outermost portion of the semiconductor dies that insulates circuitry and connections of the semiconductor dies. Conductive material 110 may be placed along portions of the dielectric layer 106 and conductive material 112 may be placed along portions of the dielectric layer 108. The conductive material 110 and the conductive material 112 may be recessed from the dielectric layer 106 and the dielectric layer 108, respectively, to form openings for the conductive material 110 and the conductive material 112 to expand into. In the semiconductor device assembly of FIG. 1, the conductive material 110 and the conductive material 112 have a width substantially equal to a width of the openings created in the dielectric layer 106 and the dielectric layer 108 (e.g., within 0.1 micron, within 0.5 micron, within 1 micron, etc.).

The semiconductor die 102 may be aligned with the semiconductor die 104 such that the conductive material 110 aligns with the conductive material 112. Once aligned, the semiconductor die 102 and the semiconductor die 104 may be coupled (e.g., stacked) and electrically connected. This coupling process may include heating the dielectric layer 106, the dielectric layer 108, the conductive material 110, and the conductive material 112. While the structures are heated, force may be applied to the semiconductor die 102 and the semiconductor die 104 to bring the dielectric layer 106 in contact with the dielectric layer 108 and cause the conductive material 110 and the conductive material 112 to volumetrically expand in a single dimension through the openings. The resulting semiconductor device assembly is illustrated by way of example in FIG. 1B.

Figure 1B:
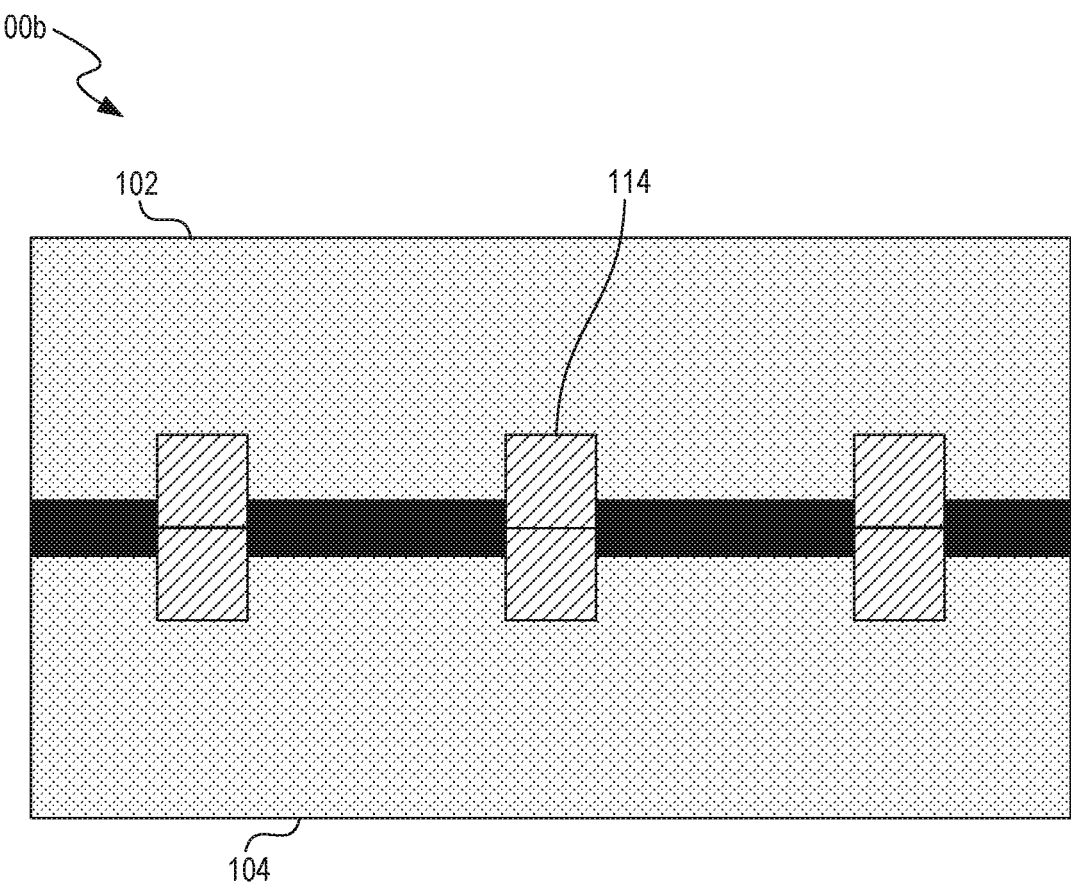

FIG. 1B illustrates an electrically connected semiconductor device assembly 100*b*. The dielectric layer 106 and the dielectric layer 108 may bond to physically couple the semiconductor die 102 and the semiconductor die 104. The semiconductor die 102 and the semiconductor die 104 are connected through interconnects 114 (e.g., conductive structures) coupled to circuitry at the semiconductor die 102 and the semiconductor die 104. The interconnects 114 may be formed through expansion of the conductive material 110 and the conductive material 112 through the openings in the dielectric layers. The conductive material 110 and the conductive material 112 may expand by an amount that causes the conductive material 110 to contact the conductive material 112, thereby enabling electrical signaling to pass from the conductive material 110 to the conductive material 112 and vice versa.

Semiconductor devices assembled through this process may be required to satisfy various design constraints. For example, conductive material used to form the interconnects 114 may only be implemented with substantially equivalent width to the openings. Similarly, the conductive material may be placed along a same central axis as the openings. Thus, the location of the conductive material may be largely restricted and inhibit the implementation of some semiconductor device designs. Moreover, the discrete portions of conductive material may not provide an ability to form redundant interconnects (e.g., interconnects carrying a common electrical signal). Such redundant interconnects may increase reliability or provide thermal regulation in a semiconductor device.

To address these drawbacks and others, various embodiments of the present application exploit the thermophysical properties of conductive material, such as copper. When heated, conductive material may expand in volume based on a coefficient of expansion. Given that this expansion is predictable, semiconductor devices may be designed with reservoirs of conductive material located adjacent to vacancies to enable the conductive material to expand into these vacancies and create connective structures that couple the various circuit components in the semiconductor device. In doing so, a robust and well-connected semiconductor device may be assembled through the thermal expansion of conductive material.

For example, a semiconductor device assembly is provided that includes two semiconductor dies. The first semiconductor die and the second semiconductor die are bonded at a dielectric layer of the first semiconductor die and a dielectric layer of the second semiconductor die to create one or more interconnect openings. The first semiconductor die includes a reservoir of conductive material located adjacent to the one or more interconnect openings and having a width greater than a width of the one or more interconnect openings. The reservoir of conductive material is heated to volumetrically expand the reservoir of conductive material through the one or more interconnect openings to form one or more interconnects electrically coupling the first semiconductor die and the second semiconductor die.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or a die-level substrate, or another die for die-stacking or 3DI applications.

A person having ordinary skill in the relevant art will recognize that suitable steps of the methods described herein can be performed at the wafer level or at the die level. Thus, although some examples may be illustrated or described with respect to dies or wafers, the technology disclosed herein may apply to dies or wafers. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 2A:
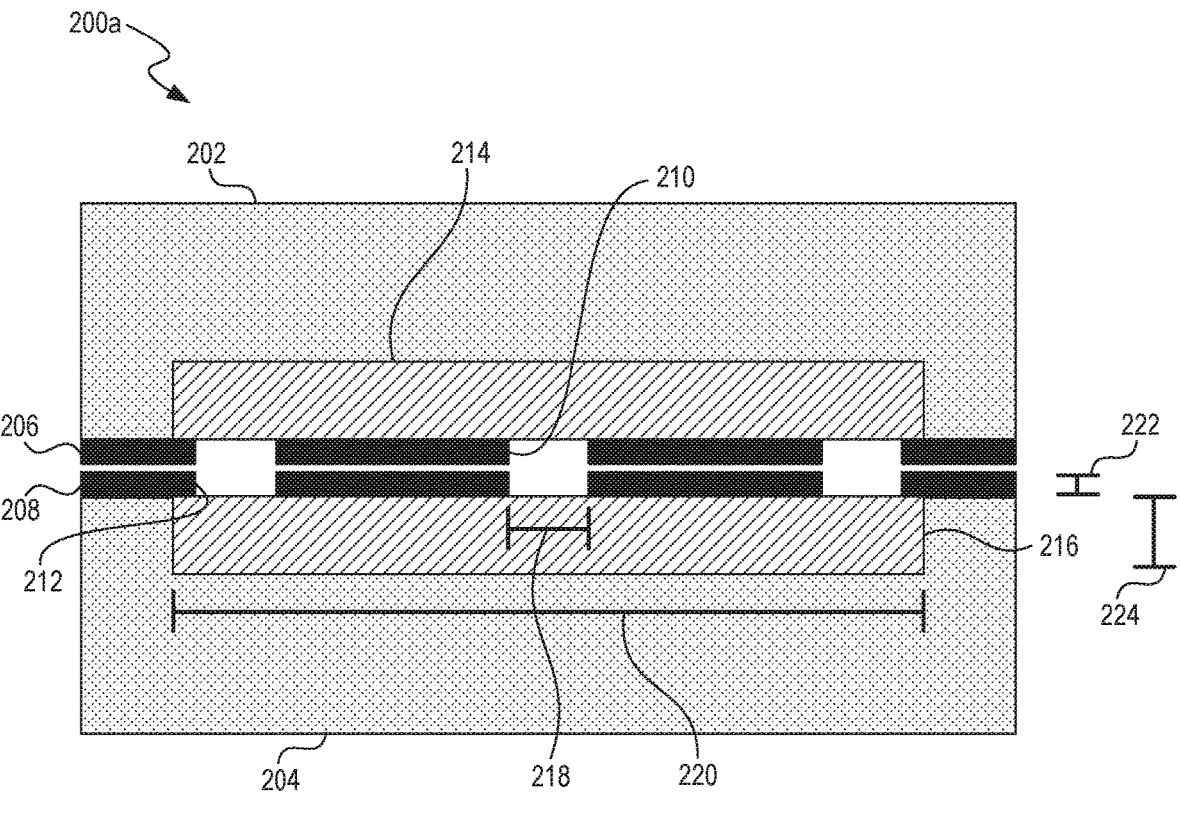
FIGS. 2A and 2B illustrate simplified schematic cross-sectional views of a series of fabrication steps for semiconductor device assemblies in accordance with an embodiment of the present technology.
Figure 2B:
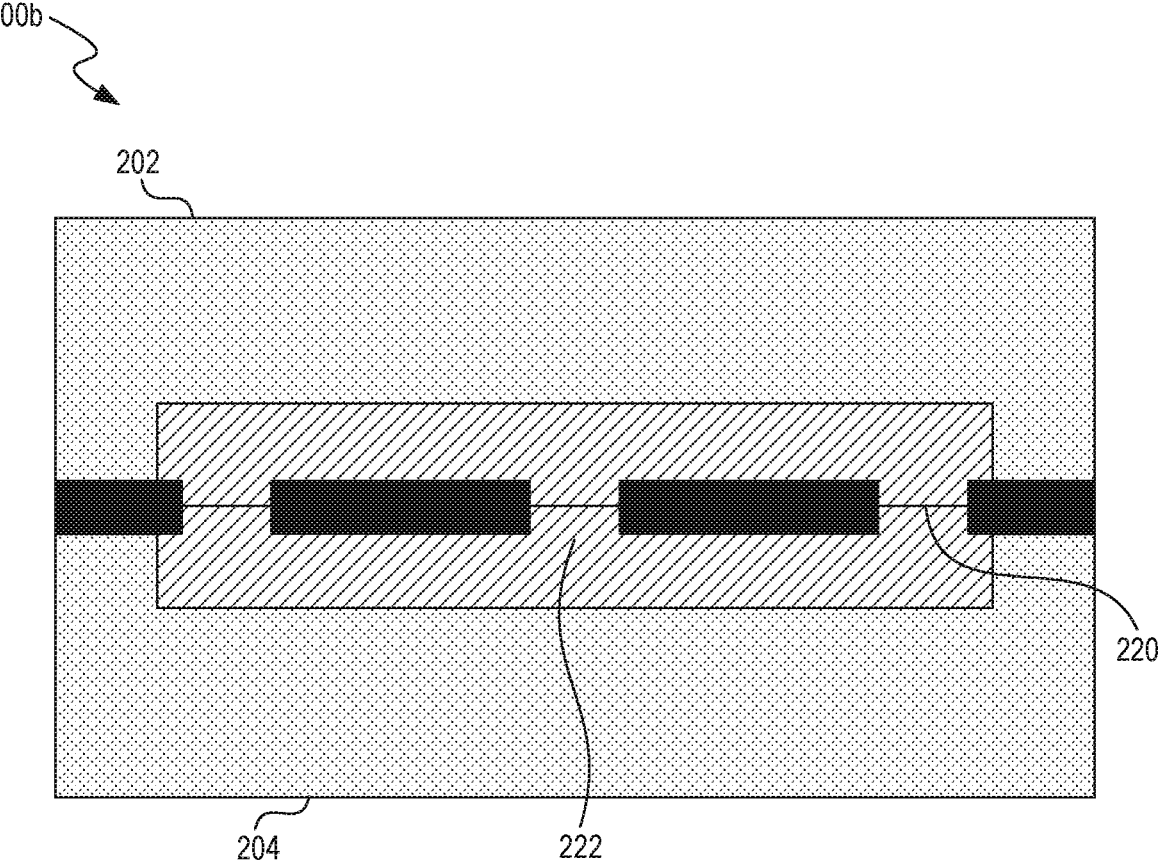

FIGS. 2A and 2B illustrate operations for fabricating a semiconductor device assembly in accordance with an embodiment of the present technology. Beginning with FIG. 2A, a semiconductor device assembly 200*a* that includes a semiconductor die 202 and a semiconductor die 204 is illustrated. The semiconductor die 202 includes a dielectric layer 206 that acts as a passivation layer to insulate circuitry and connections at the die 202. The dielectric layer 206 may include a passivized material, for example, silicon oxide, silicon nitride, silicon carbide, or silicon carbon nitride. The dielectric layer 206 may be created through any appropriate technique, for example, oxidation or deposition. Circuitry or dielectric material may be disposed at the die substrate beneath the dielectric layer 206 to implement traces, lines, vias, transistors, or other circuit elements within the semiconductor die 202. Similarly, the semiconductor die 204 includes a dielectric layer 208. The semiconductor die 204 may include a die substrate, with circuitry and dielectric layers thereon, beneath the dielectric layer 208.

Openings 210 and openings 212 may be implemented at the dielectric layer 206 and the dielectric layer 208, respectively. The semiconductor die 202 may include a reservoir of conductive material 214 adjacent to the openings 210. The semiconductor die 204 may similarly include a reservoir of conductive material 216 located adjacent to the openings 212. Although illustrated as beneath the openings 210 and the openings 212, the reservoirs of conductive material may be located at least partially within the openings 210 or the openings 212 (e.g., recessed from a bonding surface of the dielectric layers). The openings 210 and the openings 212 may provide vacancies for the conductive material 214 and the conductive material 216 to expand into. Each of the openings 210 or the openings 212 may have a width 218 that is thick enough to implement an interconnect at the openings 210 or the openings 212. For example, an opening designed for a power interconnect may be thicker than an opening designed for an input/output (I/O) interconnect to distribute the resistive heating in the semiconductor device. The reservoir of conductive material 214 or the conductive material 216 may have a width 220, which may be greater than a width 218 of the openings 210 or the openings 212. In some cases, the width 220 may be substantially greater (e.g. at least 10 percent greater, at least 15 percent greater, at least 20 percent greater, at least 25 percent greater, at least 30 percent greater, at least 40 percent greater, at least 50 percent greater, at least 100 percent greater, etc.) than the width 218. In this way, the width 220 of the reservoirs of conductive material may not be constrained to the width 218 of the openings, thereby reducing design constraints in the semiconductor device.

The openings 210 or the openings 212 may be created through any number of appropriate methods. For example, dielectric material may only be deposited around the openings 210 and openings 212. Alternatively, the dielectric material may be deposited equally across the semiconductor dies, and the openings 210 and the openings 212 may be etched into the dielectric layer 206 and the dielectric layer 208, respectively. The openings 210 or the openings 212 may be designed to have a depth 222, which as a non-limiting example may be between 0.001 microns and 1 micron. The reservoir of conductive material 214 and the reservoir of conductive material 216 may similarly be designed with a thickness 224. The thickness 224 may be determined to enable the reservoirs of conductive material to volumetrically expand through the openings and contact one another based on the width 218 of the openings, the width 220 of the reservoirs of conductive material, and a thermal expansion coefficient of the conductive material. As non-limiting examples, the thickness 224 may be between 0.5 and 5 microns.

The semiconductor die 202 and the semiconductor die 204 may be aligned such that the openings 210 correspond to the openings 212. A vacuum condition may be created around the semiconductor die 202 and the semiconductor die 204. An inert gas may be applied to the dielectric layer 206 or the dielectric layer 208. The reservoirs of the conductive material and the dielectric layers may be heated to alter properties of the dielectric material and the conductive material. For example, the dielectric material may become reactive to enable a direct bond between the dielectric layer 206 and the dielectric layer 208, and the reservoirs of conductive material may expand through the openings. Pressure may be applied to the semiconductor die 202 or the semiconductor die 204 to bond the dielectric layer 206 and the dielectric layer 208 and create interconnect openings from the openings 210 and the openings 212. The reservoirs of conductive material may extend through the interconnect openings to create the interconnects coupling the semiconductor dies. Given that the reservoirs of conductive material have a width 220 larger than the width 218 of the openings, the conductive material may expand in multiple dimensions. For example, portions of the conductive material below the opening expand vertically through the openings, and portions of the conductive material that are not directly below the openings expand laterally and move more material through the openings. The resulting semiconductor device assembly is illustrated by way of example in FIG. 2B.

FIG. 2B illustrates an example semiconductor device assembly 200b that includes the semiconductor die 202 mounted to the semiconductor die 204. The semiconductor die 202 and the semiconductor die 204 may bond at a bond line 210. The semiconductor dies may be bonded active-side-to-active-side, back-side-to-back-side, or active-side-to-back-side. The reservoirs of conductive material may extend through the interconnect openings to contact one another and form interconnects 222 electrically coupling the semiconductor die 202 and the semiconductor die 204. The reservoir of conductive material 214 and the reservoir of conductive material 216 may expand to contact one another along the bond line 220 or at any other point within the openings.

In some implementations, the interconnects 222 may be formed from a common reservoir of conductive material, and thus, the interconnects 222 may be redundant interconnects that carry a common electrical signal. This may enable the heat created from the transmission of current along the interconnects to be spread across the semiconductor dies, thereby reducing the likelihood of failure. Alternatively or additionally, the redundant interconnects may ensure that there is a functioning signal path for an electrical signal even when one of the interconnects 222 fails (e.g., due to a short circuit). In other implementations, however, each of the interconnects 222 may be created from a discrete reservoir of conductive material, and each of the signals carried along the interconnects 222 may be different.

Figure 3A:
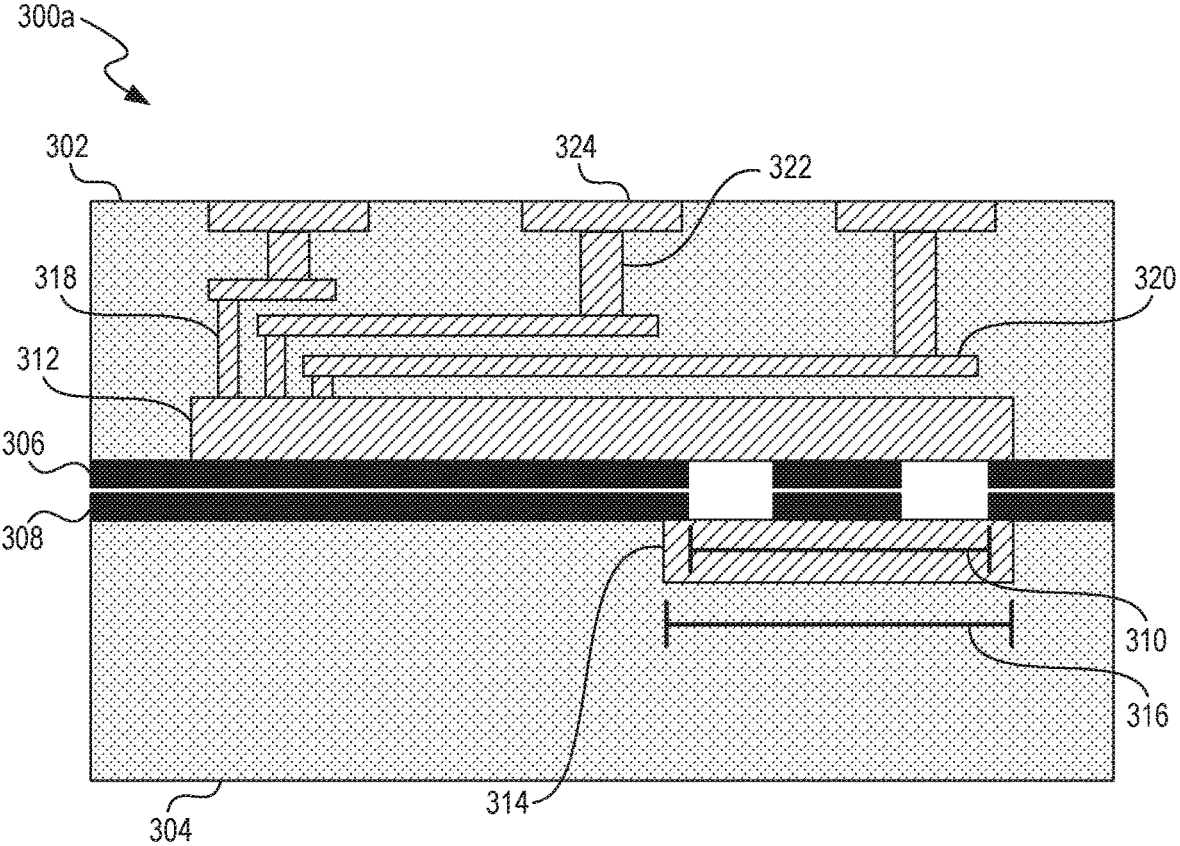
FIGS. 3A and 3B illustrate simplified schematic cross-sectional views of a series of fabrication steps for semiconductor device assemblies in accordance with an embodiment of the present technology.
Figure 3B:
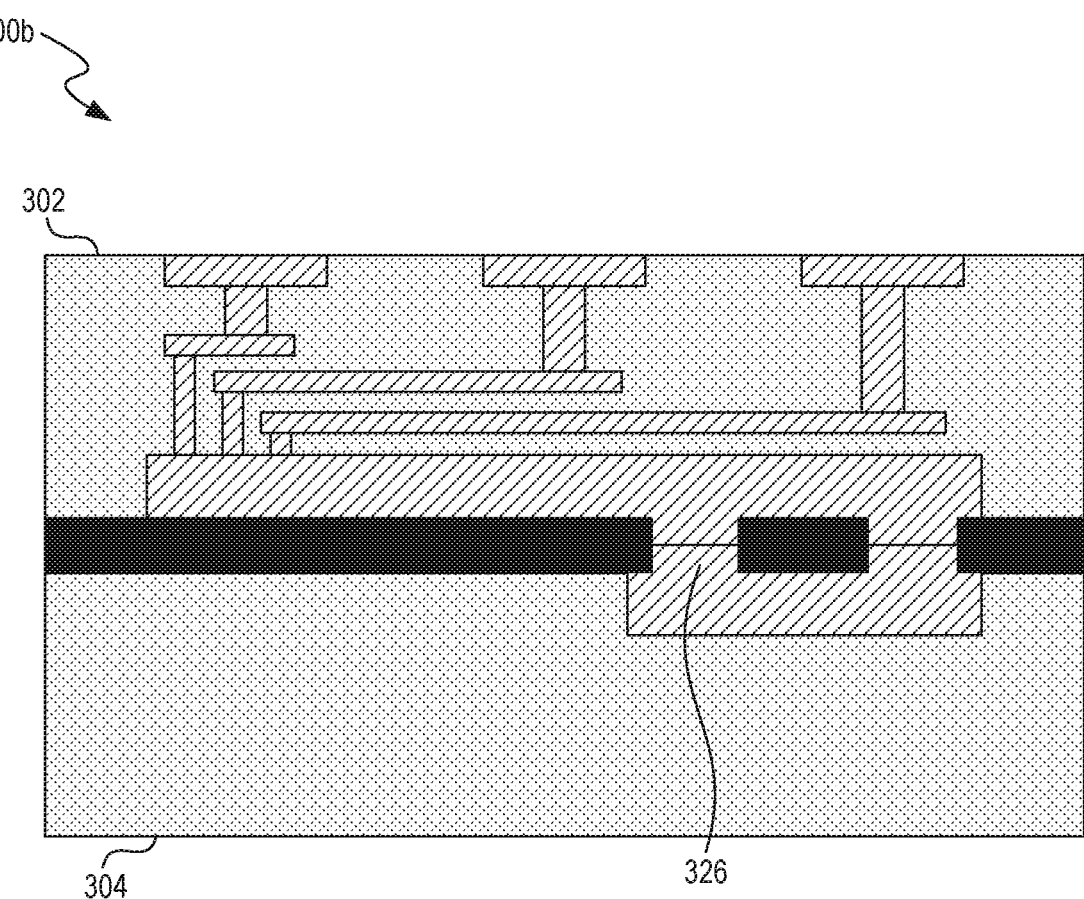

FIGS. 3A and 3B illustrate operations for fabricating a semiconductor device assembly in accordance with an embodiment of the present technology. As illustrated with reference to FIG. 3A, a semiconductor device assembly 300a includes a semiconductor die 302 and a semiconductor die 304. The semiconductor die 302 includes a dielectric layer 306, a reservoir of conductive material 312, and various circuitry, including vias 318, traces 320, through-silicon vias (TSVs 322), and contact pads 324. The semiconductor die 304 includes a dielectric layer 308 and a reservoir of conductive material 314. The reservoir of conductive material 312 and the reservoir of conductive material 314 are implemented at openings located in the dielectric layer 306 and the dielectric layer 308. The dielectric layer 306 spans a width 310 (e.g., from a first boundary of a first opening to a second boundary of a last opening). The reservoir of conductive material 314 has a width 316 greater (e.g., substantially greater) than the width 310 spanned by the openings. In this way, the reservoir of conductive material 314 may form multiple redundant interconnects.

In contrast to the reservoirs of conductive material illustrated in FIGS. 2A and 2B, the reservoir of conductive material 312 and the reservoir of conductive material 314 may have different widths or different thicknesses. These differences may enable the reservoirs of conductive material to expand different amounts into the openings. The reservoir of conductive material 312 may connect to routing circuitry in the semiconductor die 302. The routing circuitry may include one or more vias 318 that connect the reservoir of conductive material 314 to various traces 320 and other circuitry in the semiconductor die 302. The traces 320 may connect to one or more TSVs 322 that couple to contact pads 324 exposed at a surface of the semiconductor die 302 to enable external connections to additional dies or to a printed circuit board (PCB). As a result, electrical signals may be carried from the reservoir of conductive material 312 to the contact pads 324, or vice versa, and the die circuitry may perform operations using these signals. Moreover, the semiconductor die 302 and the semiconductor die 304 may be coupled to one another to enable electrical communication between the reservoir of conductive material 314 and the reservoir of conductive material 312 and any circuit components connected thereto. The resulting semiconductor device assembly is illustrated by way of example in FIG. 3B.

FIG. 3B illustrates an example semiconductor device assembly 300b that includes the semiconductor die 302 mounted to the semiconductor die 304. The semiconductor die 302 and the semiconductor die 304 electrically couple through interconnects 326 formed from reservoirs of conductive material. Given that the reservoirs of conductive material vary in size, one of the reservoirs of conductive material may expand farther through the openings than the other of the reservoirs. Once the interconnects 326 are formed, electrical signals may pass from the semiconductor die 304 to the semiconductor die 302 or any circuitry thereof. Similarly, electrical signals may be transmitted from the semiconductor die 302 to the semiconductor die 304.

Figure 4A:
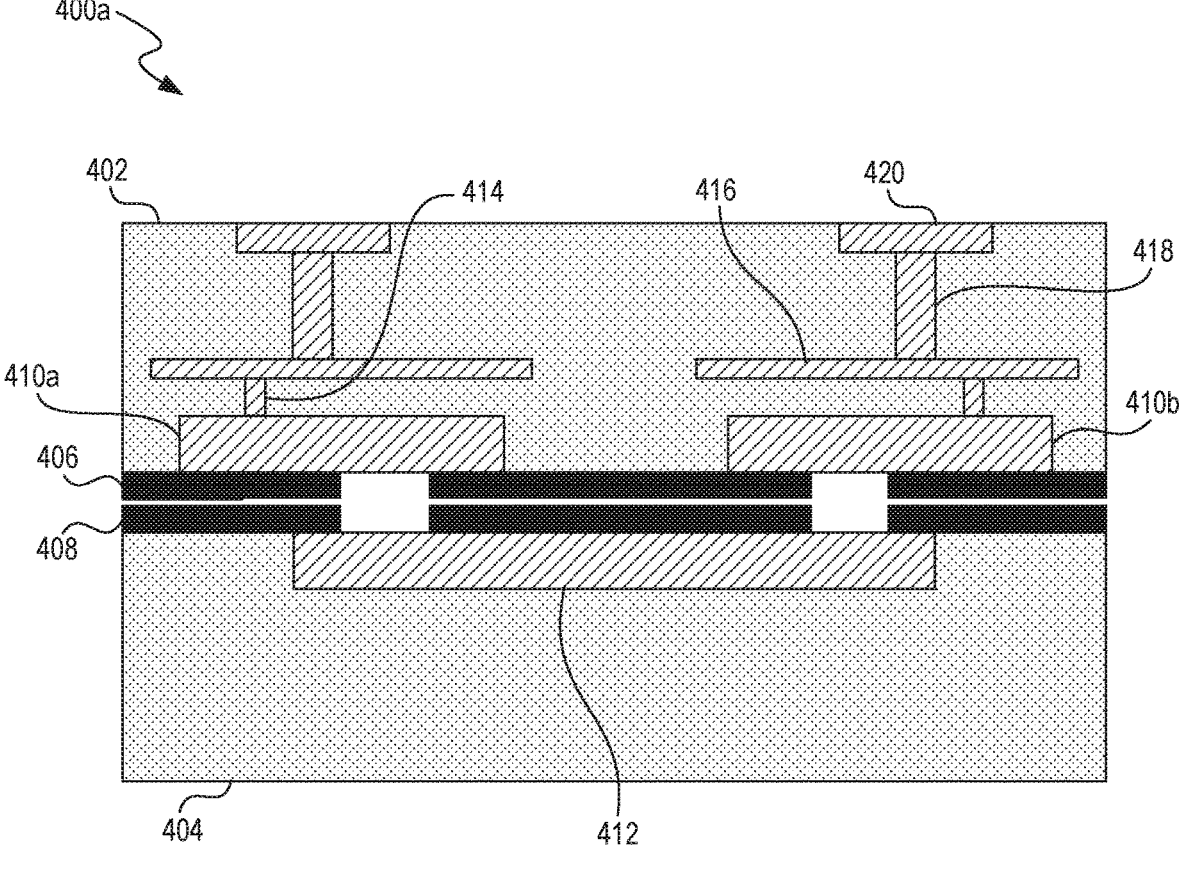
FIGS. 4A and 4B illustrate simplified schematic cross-sectional views of a series of fabrication steps for semiconductor device assemblies in accordance with an embodiment of the present technology.
Figure 4B:
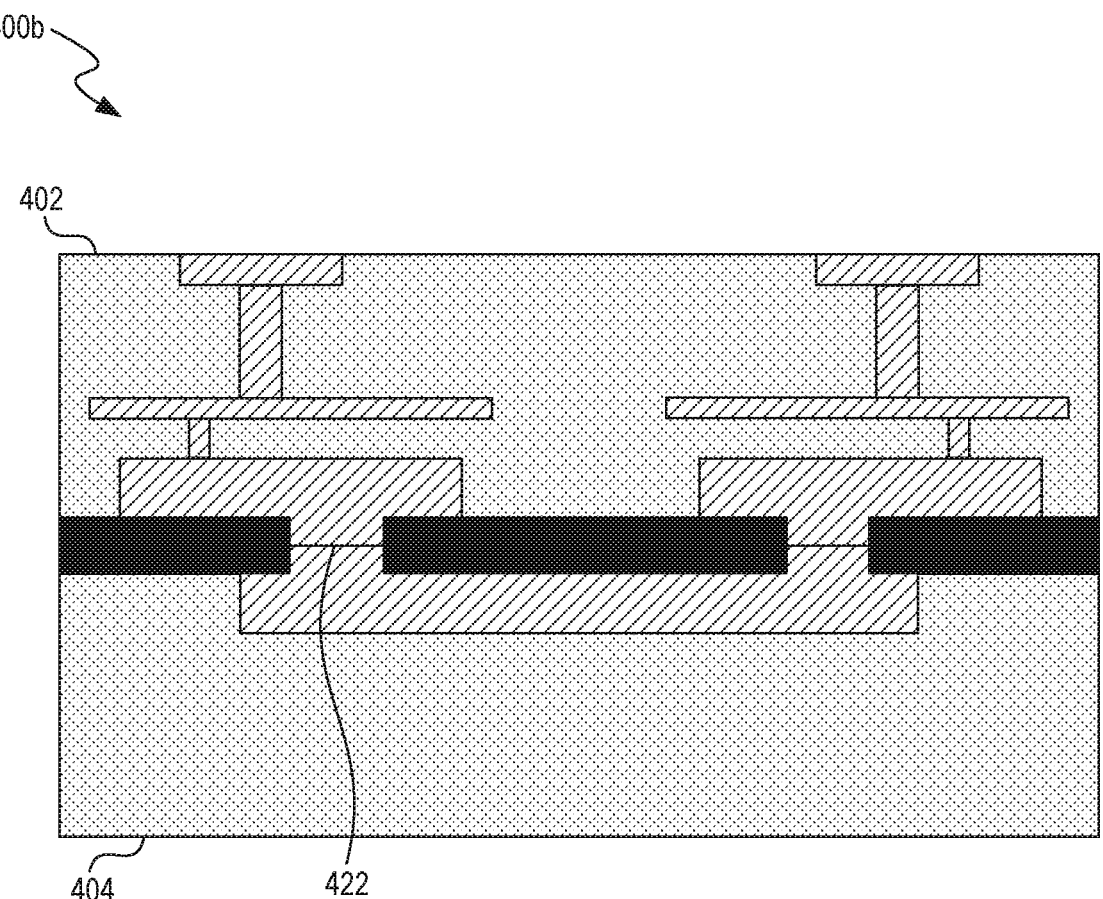

FIGS. 4A and 4B illustrate operations for fabricating a semiconductor device assembly in accordance with an embodiment of the present technology. As illustrated with reference to FIG. 4A, a semiconductor device assembly 400a includes a semiconductor die 402 and a semiconductor die 404. The semiconductor die 402 includes a dielectric layer 606, a discrete reservoir of conductive material 410a, a discrete reservoir of conductive material 410b, and various circuitry coupled to the discrete reservoirs of conductive material 410. Each of the discrete reservoirs of conductive material 410 may couple to respective circuitry including vias 414, traces 416, TSVs 418, and contact pads 420. The semiconductor die 404 includes a dielectric layer 408 and a reservoir of conductive material 412. The reservoirs of conductive material may be expanded to electrically couple the reservoirs of conductive material through the openings.

The reservoir of conductive material 412 may act as an electrical connection between the discrete reservoir of conductive material 410a and the discrete reservoir of conductive material 410b when the semiconductor die 202 and the semiconductor die 204 are electrically coupled. For example, electrical signals may pass between the reservoir of conductive material 410a and the reservoir of conductive material 410b through the conductive material 412. In some implementations, the reservoir of conductive material 412 may be a lone connection between the reservoir of conductive material 410a and the reservoir of conductive material 410b. In other implementations, the traces 416 may couple the reservoir of conductive material 410a and the reservoir of conductive material 410b.

As illustrated by the reservoirs of conductive material 410 and the reservoir of conductive material 412, the reservoirs of conductive material 410 may correspond to a single opening or to multiple openings. For example, the reservoir of conductive material 410a corresponds to a first opening, the reservoir of conductive material 410b corresponds to a second opening, and the reservoir of conductive material 412 corresponds to the first opening and the second opening. Thus, each reservoir of conductive material may implement a single, discrete interconnect or a plurality of redundant interconnects when coupled. A coupled semiconductor device assembly is illustrated by way of example in FIG. 4B.

FIG. 4B illustrates an example semiconductor device assembly 400b that includes the semiconductor die 402 mounted to the semiconductor die 404. The semiconductor die 402 and the semiconductor die 404 electrically couple through interconnects 422 formed from reservoirs of conductive material. Given that the interconnects 422 couple the reservoir of conductive material 412 to the reservoir of conductive material 410a and the reservoir of conductive material 410b, electrical signals may be carried between the reservoir of conductive material 410a and the reservoir of conductive material 410b through the reservoir of conductive material 412.

Figure 5A:
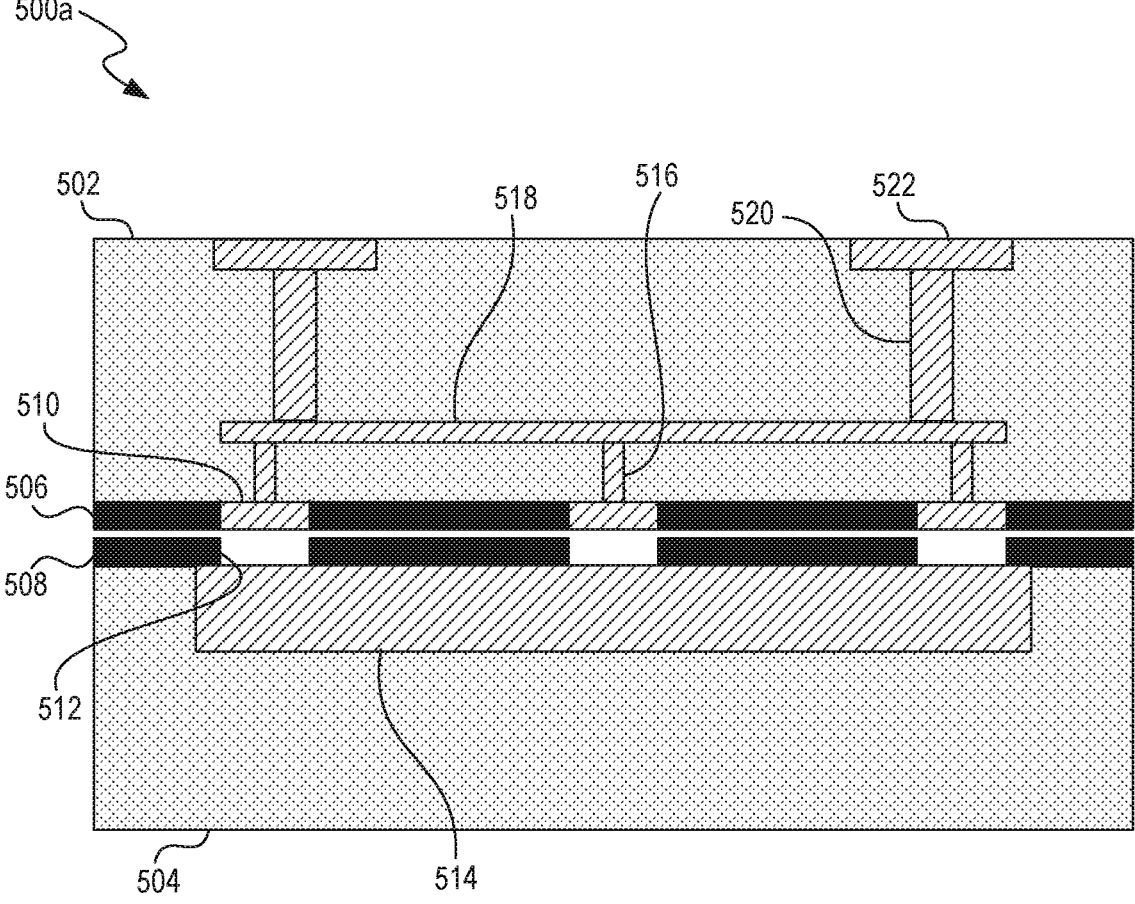
FIGS. 5A and 5B illustrate simplified schematic cross-sectional views of a series of fabrication steps for semiconductor device assemblies in accordance with an embodiment of the present technology.
Figure 5B:
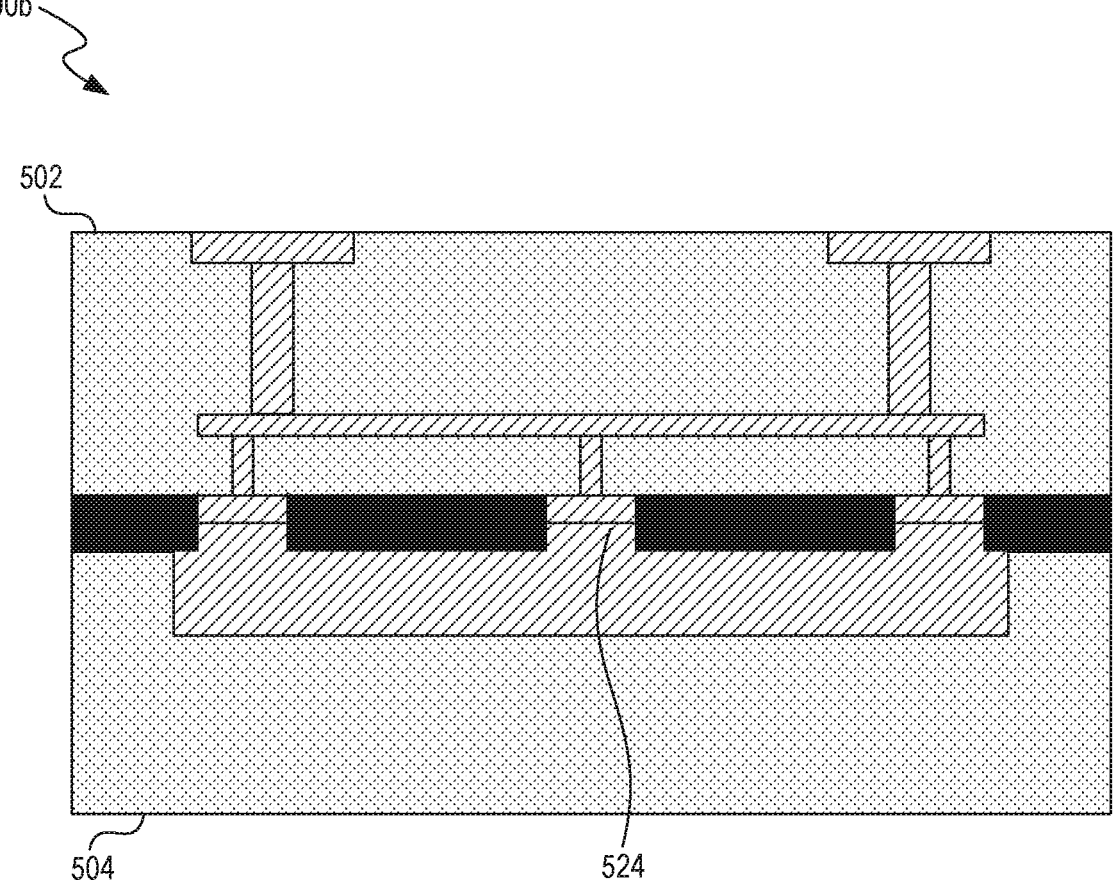

FIGS. 5A and 5B illustrate operations for fabricating a semiconductor device assembly in accordance with an embodiment of the present technology. As illustrated with reference to FIG. 5A, a semiconductor device assembly 500a includes a semiconductor die 502 and a semiconductor die 504. The semiconductor die 502 includes a dielectric layer 506, contact pads 510, and various circuitry coupled to the contact pads including vias 516, traces 518, TSVs 520, and contact pads 522. The semiconductor die 504 includes a dielectric layer 508 having openings 512 that correspond to the contact pads 510 and a reservoir of conductive material 514 adjacent to the openings 512. The reservoir of conductive material 514 may be expanded to electrically couple to the contact pads 510 through the openings 512. In contrast to the semiconductor device assemblies illustrated in FIGS. 2A through 4B, the semiconductor die 502 does not include a reservoir of conductive material. Instead, the semiconductor die 504 includes a reservoir of conductive material 514 that expands through the openings 512 and couples to the contact pads 510 at the semiconductor die 502.

The contact pads 510 may couple to one or more traces 518 through vias 516. For example, each of the contact pads 516 may couple to a common trace to form redundant interconnects or to separate traces 518 to form discrete interconnects. The traces 518 may connect to TSVs 520 that couple to exposed contact pads 522 to enable connectivity to additional dies or to a PCB. Thus, once the semiconductor die 502 and the semiconductor die 504 are connected, the semiconductor die 504 may be electrically coupled to the semiconductor die 502 or any internal or external circuit components connected thereto. An example semiconductor device assembly 500b is illustrated by way of example in FIG. 5B. The semiconductor device assembly 500b includes the semiconductor die 502 mounted to the semiconductor die 504 and electrically coupled through the interconnects 524.

Figure 6:
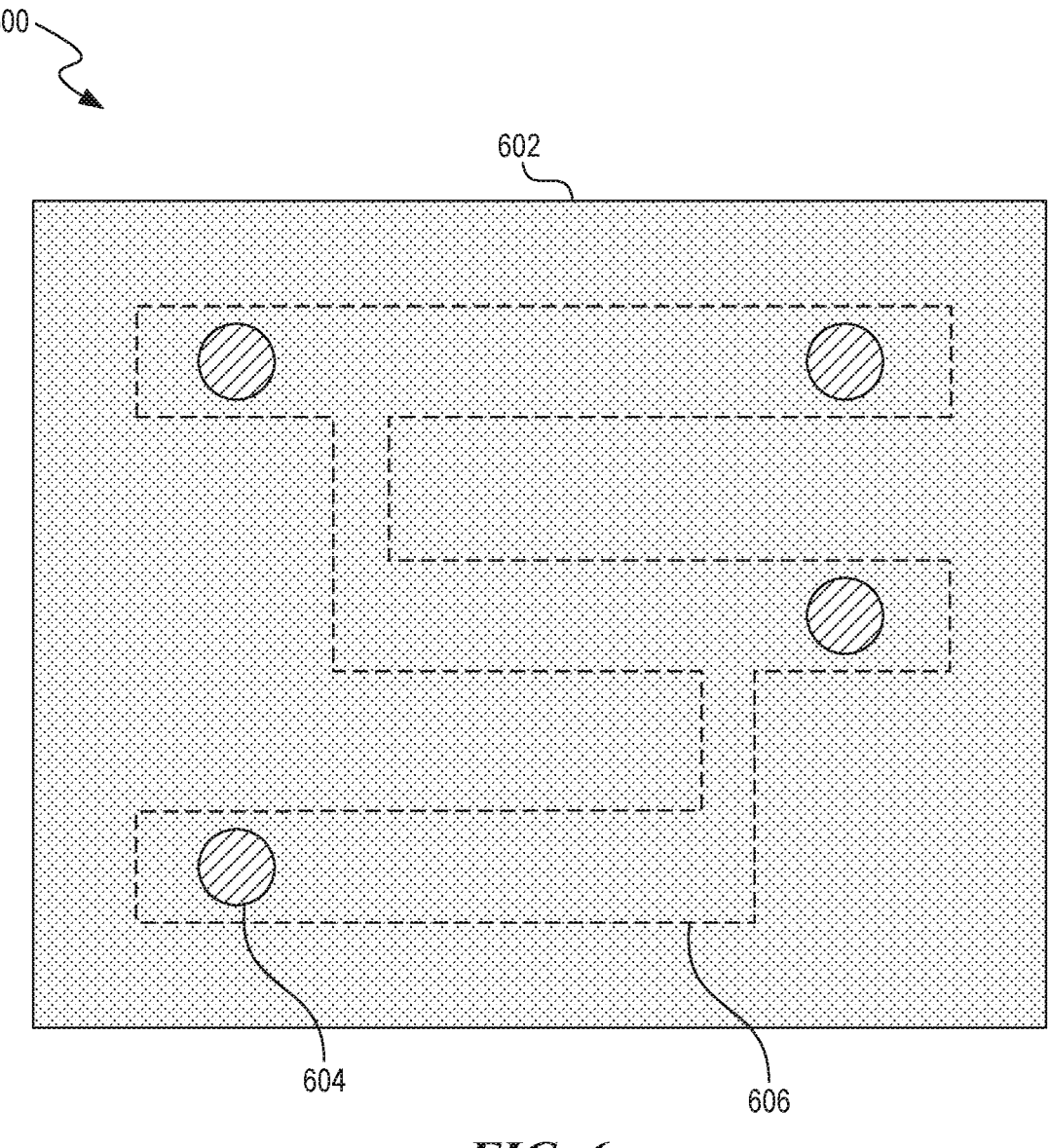
FIG. 6 illustrates a simplified schematic cross-sectional view of a semiconductor device assembly in accordance with an embodiment of the present technology.

FIG. 6 illustrates a simplified schematic overhead view of a semiconductor device assembly 600 in accordance with an embodiment of the present technology. The semiconductor device assembly 600 includes a semiconductor die 602 having openings 604 formed in a dielectric layer (e.g., at the surface illustrated in FIG. 6). A reservoir of conductive material 606 may be embedded in the semiconductor die 602 beneath the dielectric layer (illustrated with dotted lines in FIG. 6) and exposed at the openings 604. As illustrated with respect to FIG. 6, any portion of the reservoir of conductive material 606 may be laterally offset (e.g., horizontally or vertically along the plane shown in FIG. 6) from the openings 604. Similarly, the openings 604 may be laterally offset from one another. The reservoir of conductive material 606 may be a continuous reservoir of conductive material or multiple discrete reservoirs of conductive material distributed laterally across the semiconductor die 602. As a result, the reservoir of conductive material 606 may implement multiple redundant interconnects or multiple separate interconnects at the openings 604.

The reservoir of conductive material 606 can be asymmetric about one or more of the openings 604. Generally, semiconductor dies include conductive material used to implement interconnects, and this conductive material is substantially symmetric about an opening through which it expands (e.g., the opening is circular and the conductive material is also circular and aligned with the opening). In contrast, the semiconductor die 602 can include conductive material 606 that is asymmetric about an axis defined by a width of one or more of the openings 604 (e.g., in the illustrated plane) through which the conductive material 606 expands. In this way, different amounts of the conductive material 606 can be disposed on each side of the openings 604, or the conductive material 606 can be disposed in different shapes on each side of the openings 604. As a result, additional designs can be implemented for a semiconductor device.

Figure 7:
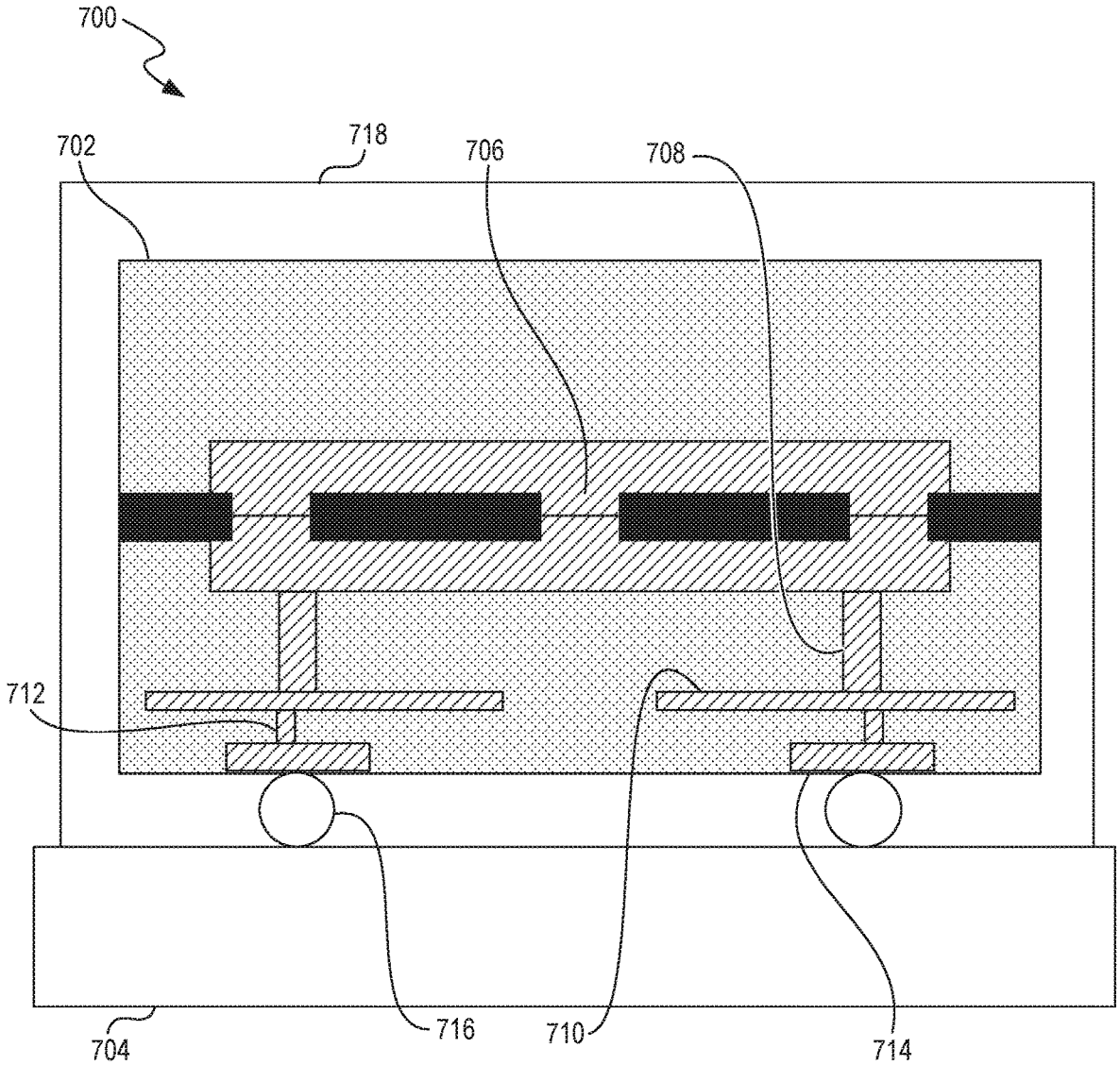
FIG. 7 illustrates a schematic view showing a system that includes a semiconductor device assembly configured in accordance with an embodiment of the present technology.

FIG. 7 illustrates a simplified schematic cross-sectional view of a semiconductor device assembly 700 in accordance with an embodiment of the present technology. The semiconductor device assembly 700 includes stacked semiconductor dies 702 assembled onto a substrate 704. The substrate 704 may include a PCB, an interposer, or one or more additional dies. The stacked semiconductor dies 702 may mechanically couple through direct bonds between the dielectric layers of the semiconductor dies. The stacked semiconductor dies 702 may electrically couple (e.g., and mechanically couple) through interconnects 706, which are formed by annealing one or more reservoirs of conductive material to volumetrically expand the conductive material through openings in the dielectric layers. The interconnects 706 couple to one or more TSVs 708 that couple to traces 710 and other circuitry within a base die of the stacked semiconductor dies 702. The traces 710 couple to contact pads 714 through vias 712 to provide external connectivity to the stacked semiconductor dies 702. For example, connective structures 716 (e.g., solder balls, copper pillars, etc.) couple the contact pads 714 to contact pads implemented at the substrate 704. The contact pads at the substrate 704 may couple to various routing circuitry that provide connectivity to one or more internal or external circuit components. The semiconductor device assemblies may be at least partially encapsulated by an encapsulant 718 to protect them from environmental factors (e.g., moisture, particulates, static electricity, and physical impact).

Although in the foregoing example embodiment semiconductor device assemblies have been illustrated and described as including a particular number of semiconductor dies, in other embodiments assemblies can be provided with more or less semiconductor dies. For example, the two-die semiconductor devices illustrated in FIGS. 2-6 could be replaced with, e.g., a vertical stack of semiconductor devices, a plurality of semiconductor devices, mutatis mutandis.

In accordance with one aspect of the present disclosure, the semiconductor devices illustrated in the assemblies of FIGS. 2A-7 could be memory dies, such as dynamic random-access memory (DRAM) dies, NOT-AND (NAND) memory dies, NOT-OR (NOR) memory dies, magnetic random-access memory (MRAM) dies, phase change memory (PCM) dies, ferroelectric random-access memory (FeRAM) dies, static random-access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 8:
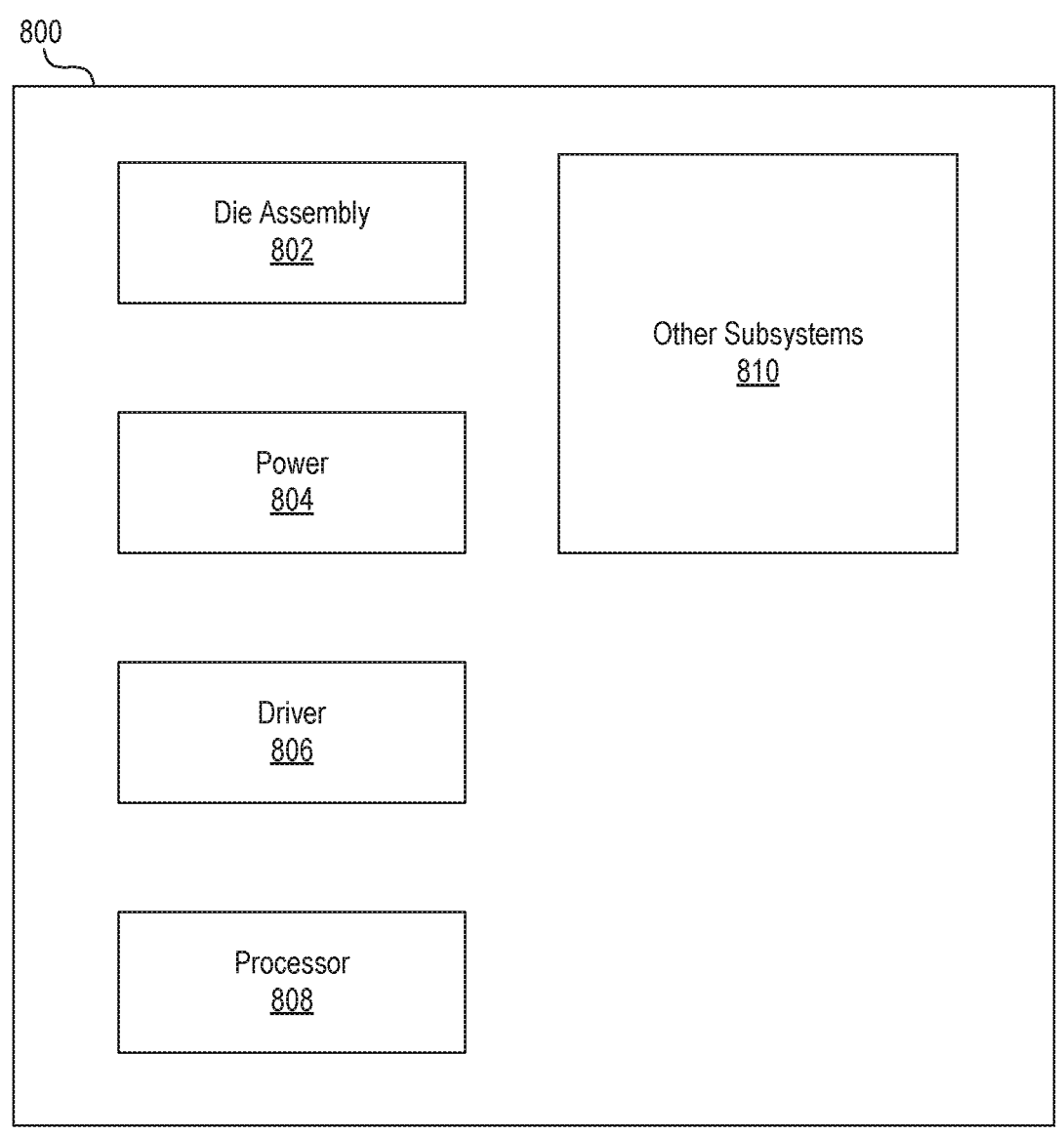
FIG. 8 illustrates an example method for fabricating a semiconductor device assembly in accordance with an embodiment of the present technology.

Any one of the semiconductor devices and semiconductor device assemblies described above with reference to FIGS. 2A-7 can be incorporated into any of a myriad of larger and/or more complex systems, a representative example of which is system 800 shown schematically in FIG. 8. The system 800 can include a semiconductor device assembly 802 (e.g., or a discrete semiconductor device), a power source 804, a driver 806, a processor 808, and/or other subsystems or components 810. The semiconductor device assembly 802 can include features generally similar to those of the semiconductor devices described above with reference to FIGS. 2A-7. The resulting system 800 can perform any of a wide variety of functions, such as memory storage, data processing, and/or other suitable functions. Accordingly, representative systems 800 can include, without limitation, hand-held devices (e.g., mobile phones, tablets, digital readers, and digital audio players), computers, vehicles, appliances, and other products. Components of the system 800 may be housed in a single unit or distributed over multiple, interconnected units (e.g., through a communications network). The components of the system 800 can also include remote devices and any of a wide variety of computer-readable media.

FIG. 9 illustrates an example method 900 for fabricating a semiconductor device assembly in accordance with an embodiment of the present technology. The method 900 may, for illustrative purposes, be described by way of example with respect to features, components, or elements of FIGS. 2A-8. Although illustrated in a particular configuration, one or more operations of the method 900 may be omitted, repeated, or reorganized. Additionally, the method 900 may include other operations not illustrated in FIG. 9, for example, operations detailed in one or more other methods described herein.

At 902, a first semiconductor die 202 is provided. The first semiconductor die 202 includes a first dielectric layer 206 having one or more first openings 210. The first semiconductor die 202 further includes a first reservoir of conductive material 214 located adjacent to the one or more first openings 210. The one or more first openings 210 may have a first width 218 and the first reservoir of conductive material 214 may have a second width 220 that is greater (e.g., substantially greater) than the first width 218. In some implementations, the one or more first openings 210 may include a plurality of first openings that span a width 310, and the width 220 of the first reservoir of conductive material 214 may be greater than the width 310. Moreover, the first semiconductor die 202 may include any number of internal or external circuitry coupled to the first reservoir of conductive material 214.

At 904, a second semiconductor die 204 is provided. The second semiconductor die 204 includes a second dielectric layer 208 having one or more second openings 212 corresponding to the one or more first openings 210. The second semiconductor die 204 may also include a second reservoir of conductive material 216 located adjacent to the one or more second openings 212. The second reservoir of conductive material 216 may have a third width greater (e.g., substantially greater) than the width 218 of the one or more first openings 210 (e.g., or the one or more second openings 212) but smaller than the second width 220 of the first reservoir of conductive material 214.

At 906, the first dielectric layer 206 and the second dielectric layer 208 are aligned such that the one or more first openings 210 align with the one or more second openings 212 to create one or more interconnect openings.

At 908, the first dielectric layer 206, the second dielectric layer 208, and the first reservoir of conductive material 214 may be heated. The heating may cause the first dielectric layer 206 to bond to the second dielectric layer 208 and cause the first reservoir of conductive material 214 to volumetrically expand (e.g., vertically and laterally) through the one or more interconnect openings to form one or more interconnects 222 electrically coupling the first semiconductor 202 die and the second semiconductor die 204. If the first reservoir of conductive material 214 spans a plurality of openings, the interconnects 222 may form a plurality of redundant interconnects. In some implementations, the second semiconductor die 204 may include a second reservoir of conductive material 216, and the heating may be effective to cause the second reservoir of conductive material 216 to expand through the one or more interconnect openings to form the one or more interconnects 222. In general, however, performing the method 900 may fabricate a robust and well-connected semiconductor device.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description of embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of making a semiconductor device assembly, comprising:
   providing a first semiconductor die including:
      a first dielectric layer having one or more first openings with a first width; and
      a first reservoir of conductive material located adjacent to the one or more first openings, the first reservoir of conductive material having a second width greater than the first width;
   providing a second semiconductor die including a second dielectric layer having one or more second openings corresponding to the one or more first openings;
   aligning the first dielectric layer and the second dielectric layer such that the one or more first openings align with the one or more second openings to create one or more interconnect openings;
   heating the first dielectric layer, the second dielectric layer, and the first reservoir of conductive material effective to:
      bond the first dielectric layer and the second dielectric layer; and
      cause the first reservoir of conductive material to volumetrically expand through the one or more interconnect openings to form one or more interconnects electrically coupling the first semiconductor die and the second semiconductor die.

2. The method of claim 1, wherein:
   the one or more second openings have a third width;
   the second semiconductor die further includes a second reservoir of conductive material located adjacent to the one or more second openings, the second reservoir of conductive material having a fourth width greater than the third width; and
   the method further includes heating the second reservoir of conductive material effective to cause the second reservoir of conductive material to volumetrically expand through the one or more interconnect openings to form the one or more interconnects electrically coupling the first semiconductor die and the second semiconductor die.

3. The method of claim 2, wherein the second width is different than the fourth width.

4. The method of claim 1, wherein:
   the one or more first openings include a plurality of first openings;
   the one or more interconnect openings include a plurality of interconnect openings; and
   the one or more interconnects include a plurality of redundant interconnects.

5. The method of claim 1, wherein:
   the plurality of first openings span a fifth width; and
   the second width is greater than the fifth width.

6. The method of claim 1, wherein the first reservoir of conductive material is volumetrically expanded in more than one dimension.

7. The method of claim 1, wherein the first semiconductor die includes internal circuitry coupled to the first reservoir of conductive material.

8. The method of claim 1, wherein the first reservoir of conductive material is located partially within the one or more first openings.

9. A semiconductor device assembly, comprising:
a first semiconductor die including:
    a first dielectric layer having a first opening with a first width; and
    a first continuous reservoir of conductive material including a first portion located adjacent to the first opening and a second portion extending through the first opening, the first portion of the first continuous reservoir of conductive material having a second width substantially greater than the first width; and
a second semiconductor die including:
    a second dielectric layer having a second opening with a third width, the second opening corresponding to the first opening; and
    a second continuous reservoir of conductive material including a first portion located adjacent to the second opening and a second portion extending through the second opening, the first portion of the second continuous reservoir of conductive material having a fourth width substantially greater than the third width,
wherein the first dielectric layer and the second dielectric layer are bonded at a bond line, and
wherein the first continuous reservoir of conductive material and the second continuous reservoir of conductive material bond at the bond line to form an interconnect electrically coupling the first semiconductor die and the second semiconductor die.

10. The semiconductor device assembly of claim 9, wherein the second width is different from the fourth width.

11. The semiconductor device assembly of claim 9, wherein the conductive material includes copper.

12. The semiconductor device assembly of claim 9, wherein the second portion of the first continuous reservoir of conductive material or the second portion of the second continuous reservoir of conductive material has a first thickness between 0.5 microns and 10 microns.

13. The semiconductor device assembly of claim 9, wherein the first opening or the second opening has a depth between 0.001 microns and 1 micron.

14. The semiconductor device assembly of claim 9, wherein the first continuous reservoir of conductive material is asymmetric about an axis defined by the first width of the first opening.

15. A semiconductor device assembly, comprising:
a first semiconductor die including:
    a first dielectric layer having a plurality of openings spanning a first width; and
    a continuous reservoir of conductive material including a first portion located adjacent to the plurality of openings and a second portion extending through the plurality of openings, the first portion of the continuous reservoir of conductive material having a second width greater than the first width; and
a second semiconductor die including a second dielectric layer having a plurality of contact pads corresponding to the first plurality of openings,
wherein the first dielectric layer and the second dielectric layer are bonded, and
wherein the continuous reservoir of conductive material and the plurality of contact pads couple to form a plurality of redundant interconnects electrically coupling the first semiconductor die and the second semiconductor die.

16. The semiconductor device assembly of claim 15, wherein the conductive material includes copper.

17. The semiconductor device assembly of claim 15, wherein the second portion of the continuous reservoir of conductive material has a first thickness between 0.5 microns and 10 microns.

18. The semiconductor device assembly of claim 15, wherein the plurality of openings have a depth between 0.001 microns and 1 micron.

19. The semiconductor device assembly of claim 15, wherein the first semiconductor die includes internal circuitry coupled to the continuous reservoir of conductive material.

20. The semiconductor device assembly of claim 15, wherein the second semiconductor die includes internal circuitry coupled to the plurality of contact pads.

* * * * *